(12) United States Patent
Guentert et al.

(10) Patent No.: US 8,678,191 B2
(45) Date of Patent: Mar. 25, 2014

(54) LEAD FRAME MAGAZINE COVER

(75) Inventors: Juergen Guentert, Traunstein (DE); Bernard Schuhler, Sigolsheim (FR)

(73) Assignee: Micronas GmbH, Freiburg (DE)

( * ) Notice: Subject to any disclaimer, the term of this patent is extended or adjusted under 35 U.S.C. 154(b) by 1484 days.

(21) Appl. No.: 11/894,672

(22) Filed: Aug. 21, 2007

(65) Prior Publication Data

US 2008/0047870 A1 Feb. 28, 2008

(30) Foreign Application Priority Data

Aug. 21, 2006 (DE) .................. 10 2006 038 997

(51) Int. Cl.
*B65D 85/00* (2006.01)

(52) U.S. Cl.
USPC .......... 206/724; 206/701; 206/722; 206/723; 206/725

(58) Field of Classification Search
USPC ......................... 206/701, 722–725
See application file for complete search history.

(56) References Cited

U.S. PATENT DOCUMENTS

| | | | | |
|---|---|---|---|---|
| 3,124,248 A | * | 3/1964 | Geoffrion | 206/723 |
| 3,454,154 A | * | 7/1969 | Briney et al. | 206/724 |
| 4,483,441 A | * | 11/1984 | Akizawa et al. | 206/716 |
| 5,075,962 A | * | 12/1991 | Gibson | 29/827 |
| 5,226,226 A | * | 7/1993 | Fierkens | 29/827 |
| 5,418,692 A | * | 5/1995 | Nemoto | 361/809 |
| 5,597,074 A | | 1/1997 | Ko | |
| 5,909,812 A | | 6/1999 | Thibaudeau | |

FOREIGN PATENT DOCUMENTS

| | | |
|---|---|---|
| DE | 29500447.9 | 4/1995 |
| GB | 2138213 A | 10/1984 |
| JP | 06122487 | 5/1994 |
| JP | 6171684 | 6/1994 |
| JP | 11-115984 | 4/1999 |
| JP | 11115984 A | 4/1999 |
| JP | 2001-114336 | 4/2001 |
| KR | 2001-0028603 | 4/2001 |

\* cited by examiner

*Primary Examiner* — J. Gregory Pickett
*Assistant Examiner* — Blaine Neway
(74) *Attorney, Agent, or Firm* — Muncy, Geissler, Olds & Lowe, P.C.

(57) ABSTRACT

The invention relates to a lead frame magazine cover for closing of an opening of a lead frame magazine by insertion of a magazine cover into the lead frame magazine in a closing direction. The lead frame magazine cover includes a recess. The recess is constructed in the region of a front edge of the magazine cover in the closing direction of the magazine cover.

16 Claims, 1 Drawing Sheet

LEAD FRAME MAGAZINE COVER

FIELD OF THE INVENTION

The invention relates to a lead frame magazine cover for closing of a lead frame magazine. In particular, the invention relates to closing of the opening of a lead frame magazine, in which the magazine cover is slid into the lead frame magazine.

BACKGROUND

Lead frame magazines are transport and storage boxes for so called lead frames. The populated lead frames are introduced through an opening into the lead frame magazine and, for example, deposited on a support, or held in guide rails. The magazine cover prevents the lead frame from sliding out. The magazine cover is introduced into the guide rails, which are constructed in lateral walls of the lead frame magazine. The lead frame is in particular a copper foil which is populated with structural. The structural elements are computer chips and other electronic components. These components are soldered or bonded by the use of small wires, so called bonding wires to strip conductors or to sections of the copper foils, which are later to be shaped in this manner.

It is disadvantageous when the lead frames are not completely pushed into the lead frame magazine, or when they slide out again. When the magazine cover is pushed closer into the closing direction, the front edge of the magazine cover in the closing direction can cause damage to the bonding wires or other components on the lead frame. In particular, during closing, damage can occur that is hardly visible. Such damage can later influence the function of the lead frame or of its elements.

SUMMARY

An object of the present invention is therefore to provide a magazine cover that makes it possible to eliminate or reduce the risk of such damage.

This object is achieved with a lead frame magazine cover according to embodiments described herein.

Preferred is a lead frame magazine cover for closing of an opening of a lead frame magazine by sliding the magazine cover into the lead frame magazine in a closing direction, wherein a recess is formed in the region of the cover edge of the magazine cover in the closing direction of the magazine cover. Such a recess prevents the structural elements deployed on the lead frame that are projecting somewhat from the lead frame magazine, from becoming damaged during the closing of the lead frame.

A recess in the closing direction is preferably constructed in a region opposite to at least one structural element on the surface of a lead frame which can be accommodated in the lead frame magazine. The cover will thus rest only on a region of the lead frame which is not populated.

From the cover edge the recess has a height that is preferably greater than the structural element height of the structural element. This makes it possible to ensure that during the insertion of the magazine cover, its front edge will not collide in the direction of the insertion with a structural element of the lead frame which is projecting from the magazine. Damage to such structural elements with a height that is smaller that the height of the recess are thus prevented. The at least one structural element is preferably a bond wire.

A wall of the magazine cover can be constructed such that the recess may be enlarged, depending on what is required from the lead frame. This can be achieved for instance with predetermined breaking points, which then make it possible to break off the wall sections. Recesses or notches can thus be worked into such a cover at a later point.

In the lateral direction perpendicular to the closing direction the recess is preferably limited by a wall section of the lead frame magazine covers projecting in the closing direction.

The projecting wall section is constructed in the closing direction opposite a lead frame in a region of the lead frame, wherein no structural elements, or only structural elements which cannot be damaged by a collision are created in this region of the a surface of the lead frame which can be accommodated in the lead frame magazine. The cover can thus rest only on a particular region of the lead frame which is not populated.

The magazine cover is preferably manufactured from a plastic material by means of an injection molding process. This makes it possible to provide a suitable magazine cover which has a suitable recess directly during its manufacture. Particularly preferred, however, is when the magazine cover is constructed from a metallic or electrically conductive material, because this enables to create an electromagnetic shield of the lead frames that are accommodated in the lead frame magazine.

The above described features and advantages, as well as others, will become more readily apparent by reference to the following detailed description and accompanying drawings.

DETAILED DESCRIPTION

Figure 1:
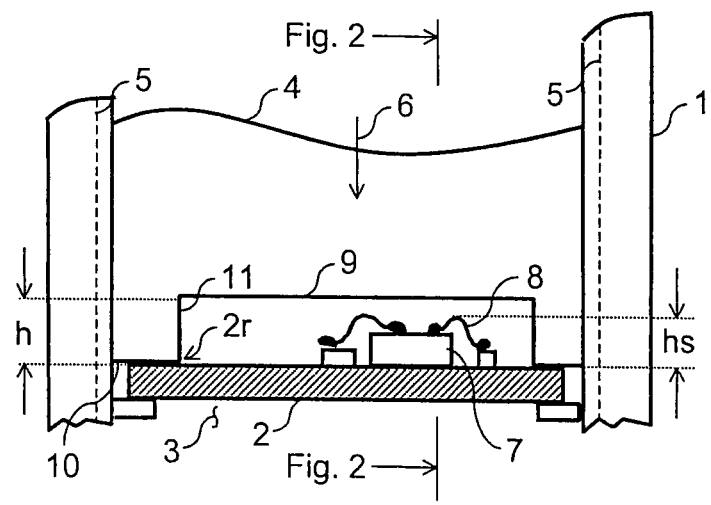
FIG. 1 shows a sectional view of a lead frame magazine, provided with a partially projecting lead frame and with a partially closed lead frame magazine cover.
Figure 2:
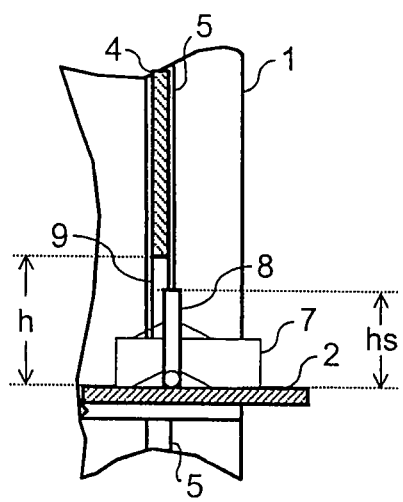
FIG. 2 shows a lateral view of the embodiment according to FIG. 1.

In FIG. 1 and FIG. 2 is shown by way of example a lead frame magazine 1, which is to accommodate so called lead frames 2. To enable the insertion of such a lead frame 2, indicated schematically in the figure, the lead frame magazine 1 is provided with an opening 3, which can be closed with a lead frame magazine cover 4.

In order to close the opening 3 with the lead frame magazine cover 4, the lead frame magazine 1 is provided with guide rails 5, for example, grooves in the side walls thereof. The closing is performed accordingly by insertion of the lead frame magazine cover 4 into the guide rails 5 in a closing direction 6.

If a lead frame 2 is projecting in the region of the opening 3, or if it is projecting from the opening 3, structural elements arranged on this lead frame in particular a chip 7 or a sensitive bonding wire 8 can be damaged. To prevent this, the lead frame magazine cover 4 is equipped with a recess 9 in the front section in the closing direction 6. This recess 9 leads from a front edge 10 in the closing direction 6 of the lead frame magazine cover 4 into the lead frame magazine cover 4.

The recess 9 is arranged and dimensioned in such a way so that there is no contact between structural elements such as bonding wires 8 or other structural components and the front edge 10 of the magazine cover 4 in its closing direction 6. The magazine cover 4 is in contact with the lead frame 2 in one or several regions 2r of the surface of the lead frame 2 in which no structural components that can be damaged, such as structural members or bonding wires 8 are arranged. Damaging of sensitive structural elements is therefore prevented in this manner.

The recess 9 is preferably extending from the front edge 10 into the lead frame magazine cover 4, so that the recess height h is equal to or greater than the structural element height hs of the structural element. The height h of the recess 9 is selected so that a safety distance is preferably provided, which takes into consideration the tolerances of the structural elements. Preferably a recess width, which is perpendicular to the closing direction 6, is fitted to the requirements of the lead frames 2 accommodated in the lead frame magazine 1.

The recess 9 is preferably constructed approximately in the center of the magazine cover 4. Depending on the placement of structural elements on the lead frame 2, the recess 9 can be also placed in another position. Multiple such recesses 9 can be also constructed in the magazine cover 4. In particular, one or several recesses 9 can be created, for example, extending perpendicular to the closing direction 6 from a bar like constructed protrusion which is front sided in the closing direction 6, to the lateral edge to the magazine cover 4.

Such a magazine cover 4 with a recess 9 can be manufactured by injection molding in one operational step. However, the recess 9 can be also constructed subsequently, or a larger size can be created, in particular in the case when the product is manufactured using a metallic material or a material that is coated with metal material.

The wall 11 of the magazine cover 4 can be optionally constructed so that the recess 9 can be subsequently further developed or enlarged, depending on the requirements on the lead frame 2 to be incorporated therein. It is also possible to provide for example breaking points in the wall 11 of the magazine cover 4, which can be used subsequently in order to enlarge the recess 9.

What is claimed is:

1. A lead frame magazine cover for closing an opening of a lead frame magazine through which lead frames are introduced into the lead frame magazine, the lead frame magazine including guide rails in lateral walls of the lead frame magazine, the lead frame magazine cover comprising:
    a magazine cover configured for insertion into the guide rails of the lead frame magazine, the guide rails guiding the magazine cover in a closing direction into the opening of the lead frame magazine, the magazine cover including a recess created in a region of a front edge of the magazine cover in the closing direction of the magazine cover.

2. The lead frame magazine cover according to claim 1, wherein the recess is created in the closing direction, opposite a region a lead frame located in the lead frame magazine that is populated with structural elements that can be damaged by the magazine cover.

3. The lead frame magazine cover according to claim 2, wherein from the front edge a recess height of the recess is greater than a structural element height of the structural element.

4. The lead frame magazine cover according to claim 2, wherein the at least one structural element includes a bonding wire.

5. The lead frame magazine cover according to claim 1, further comprising a wall configured for enlargement of the recess depending on the embodiments of a lead frame to be inserted therein.

6. The lead frame magazine cover according to claim 1, wherein the recess is limited in a lateral direction perpendicular to the closing direction by at least one wall section of the magazine cover that extends in the closing direction.

7. The lead frame magazine cover according to claim 6, wherein a portion of the wall section is arranged to be accommodated in the lead frame magazine where no structural elements or no structural elements that can be damaged by collision with the magazine cover are located.

8. The lead frame magazine cover according to claim 1 wherein the magazine cover is manufactured by means of a injection molding process.

9. A lead frame magazine arrangement comprising:
    a lead frame magazine having an opening through which lead frames are introduced into the lead frame magazine, and guide rails located on lateral walls of the lead frame magazine with respect to the opening; and
    a magazine cover for closing of the opening of the lead frame magazine, the magazine cover being configured for insertion into the guide rails of the lead frame magazine, the guide rails guiding the magazine cover in a closing direction into the opening of the lead frame magazine, the magazine cover including a recess created in a region of a front of the magazine cover in the closing direction of the magazine cover.

10. The lead frame magazine arrangement according to claim 9, wherein the recess is created in the closing direction, opposite a region of a lead frame located in the lead frame magazine that is populated with structural elements that can be damaged by the magazine cover.

11. The lead frame magazine arrangement according to claim 10, wherein from the front edge a recess height of the recess is greater than a structural element height of the structural element.

12. The lead frame magazine arrangement according to claim 10, wherein the at least one structural element includes a bonding wire.

13. The lead frame magazine arrangement according to claim 9, further comprising a wall configured for enlargement of the recess depending on the embodiments of a lead frame to be inserted therein.

14. The lead frame magazine arrangement according to claim 9, wherein the recess is limited in a lateral direction perpendicular to the closing direction by at least one wall section of the magazine cover that extends in the closing direction.

15. The lead frame magazine arrangement according to claim 14, wherein a portion of the wall section is arranged to be accommodated in the lead frame magazine where no structural elements or no structural elements that can be damaged by collision with the magazine cover are located.

16. The lead frame magazine arrangement according to claim 10, wherein the magazine cover is manufactured by means of a injection molding process.

\* \* \* \* \*